(12) United States Patent
Ying

(10) Patent No.: US 11,195,889 B2
(45) Date of Patent: Dec. 7, 2021

(54) METHOD OF MANUFACTURING FLEXIBLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Jun Ying, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 335 days.

(21) Appl. No.: 16/478,935

(22) PCT Filed: Apr. 15, 2019

(86) PCT No.: PCT/CN2019/082622
§ 371 (c)(1),
(2) Date: Jul. 18, 2019

(87) PCT Pub. No.: WO2020/124892
PCT Pub. Date: Jun. 25, 2020

(65) Prior Publication Data
US 2021/0335922 A1    Oct. 28, 2021

(30) Foreign Application Priority Data
Dec. 19, 2018 (CN) .......................... 201811552106.7

(51) Int. Cl.
*H01L 27/32* (2006.01)
*H01L 51/52* (2006.01)
(Continued)

(52) U.S. Cl.
CPC ...... *H01L 27/3244* (2013.01); *H01L 51/0097* (2013.01); *H01L 51/5237* (2013.01);
(Continued)

(58) Field of Classification Search
None
See application file for complete search history.

(56) References Cited

U.S. PATENT DOCUMENTS

2013/0148312 A1    6/2013  Han et al.
2015/0255522 A1*   9/2015  Sato ................... H01L 51/0097
                                                              257/88

(Continued)

FOREIGN PATENT DOCUMENTS

CN    106129081 A    11/2016
CN    107015438 A     8/2017
CN    108924291 A    11/2018

*Primary Examiner* — J. E. Schoenholtz

(57) ABSTRACT

The present invention provides a flexible display panel and a manufacturing method thereof. The flexible display panel includes a substrate made of a flexible material, a thin film transistor substrate disposed on the substrate, a light emitting layer disposed on the thin film transistor substrate, and an encapsulation layer disposed on the light-emitting layer. A bending region is disposed in a display area of the flexible display panel, and a buffer structure having a wave shape is disposed at the bending region on a side of the substrate away from the thin film transistor substrate.

6 Claims, 4 Drawing Sheets

(51) Int. Cl.
*H01L 51/00* (2006.01)
*H01L 51/56* (2006.01)

(52) U.S. Cl.
CPC ........ *H01L 51/56* (2013.01); *H01L 2227/323* (2013.01); *H01L 2251/5338* (2013.01); *H01L 2251/558* (2013.01)

(56) References Cited

U.S. PATENT DOCUMENTS

| | | | |
|---|---|---|---|
| 2016/0204183 A1* | 7/2016 | Tao | H01L 27/3276 257/40 |
| 2016/0329520 A1* | 11/2016 | Namkung | H01L 51/5253 |
| 2018/0287095 A1 | 10/2018 | Namkung et al. | |
| 2019/0379773 A1 | 12/2019 | Zheng | |

* cited by examiner

METHOD OF MANUFACTURING FLEXIBLE DISPLAY PANEL

BACKGROUND OF INVENTION

Field of Invention

The present invention relates to a field of display technology, and in particular, to a flexible display panel and a method of manufacturing the same.

Description of Prior Art

An organic light-emitting display (OLED) has advantages of self-illumination, fast response time, high contrast, and flexible display. It is recognized as the most promising flat panel display technology of the next generation.

At present, there are few flexible bending products that are actually realized on the market, and they are usually static bending products with a large radius of curvature. It is an important development direction in the future to achieve a dynamic bendable, foldable, curable, and flexible bending device.

However, at present, flexible display devices generally face problems such as poor bending resistance and low reliability, and especially in a case where the radius of curvature is small, the film stress is likely to be excessive, resulting in display problems.

SUMMARY OF INVENTION

A flexible display panel is provided, including: a substrate made of a flexible material; a thin film transistor substrate disposed on the substrate; a light-emitting layer disposed on the thin film transistor substrate; and an encapsulation layer disposed on the light-emitting layer, wherein a bending region is disposed in a display area of the flexible display panel, a buffer structure having a wave shape is disposed at the bending region on a side of the substrate away from the thin film transistor substrate, and the buffer structure is a discontinuous structure having a thickness of 1 to 15 microns.

Further, the buffer structure includes a plurality of mutually independent grooves.

A flexible display panel is provided, including: a substrate made of a flexible material; a thin film transistor substrate disposed on the substrate; a light-emitting layer disposed on the thin film transistor substrate; and an encapsulation layer disposed on the light-emitting layer, wherein a bending region is disposed in a display area of the flexible display panel, a buffer structure having a wave shape is disposed at the bending region on a side of the substrate away from the thin film transistor substrate.

Further, the buffer structure is a discontinuous structure.

Further, the buffer structure includes a plurality of mutually independent grooves.

Further, the substrate has a thickness of 1 to 15 microns.

A method of manufacturing a flexible display panel is further provided, including the following steps: S10, coating a photosensitive material layer on a base; S20, patterning the photosensitive material layer to form a patterned photosensitive material layer; S30, coating a flexible material to cover the photosensitive material layer on the base to form a substrate; S40, removing the photosensitive material layer, thereby forming buffer structure having a wave shape on the substrate; S50, forming a thin film transistor substrate, a light-emitting layer, and an encapsulation layer on the substrate; and S60, separating the base from the substrate.

Further, in the step S40, the substrate is placed in a stripping solution to remove the photosensitive material layer.

Further, after the step S40, and before the step S50, the method of manufacturing the flexible display panel further includes: S70, planarizing a surface of the substrate.

Further, the buffer structure includes a plurality of mutually independent grooves.

Further, the photosensitive material layer has a thickness of 1 to 10 μm.

Further, the substrate has a thickness of 1 to 15 μm.

By providing a buffer structure in the bending region, when the flexible display panel is bent, the stress generated when the film is bent is released by the buffer structure to prevent stress concentration, thereby improving the bending resistance of the flexible display panel, reducing the effect of stress on the screen when it is bent.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

Figure 1:
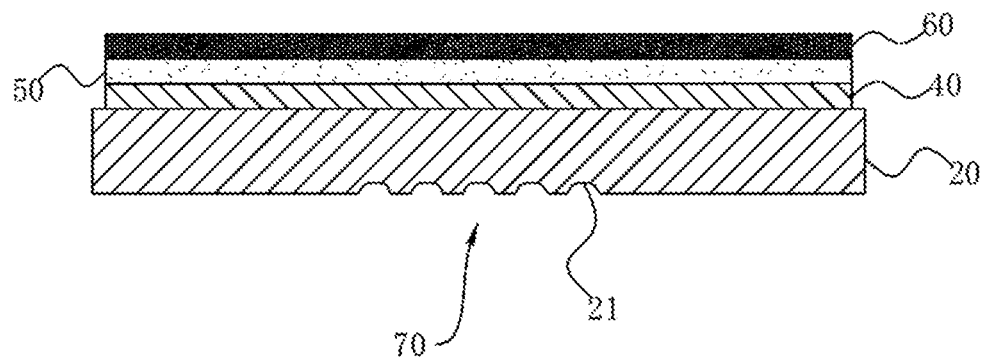
FIG. 1 is a schematic view of a flexible display panel when it is not bent according to an embodiment of the present invention.

Elements in the drawings are designated by reference numerals listed below.

10, substrate; 20, substrate; 21, buffer structure; 30, photosensitive material layer; 40, thin film transistor substrate; 50, light-emitting layer; 60, encapsulation layer; 70, bending region.

DETAILED DESCRIPTION OF PREFERRED EMBODIMENTS

The following description of the various embodiments is provided to illustrate the specific embodiments of the present invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

An object of the present invention is to solve the display problems of the existing flexible display device, which generally has a poor bending resistance, low reliability, and the film stress is likely to be excessive.

Figure 2:
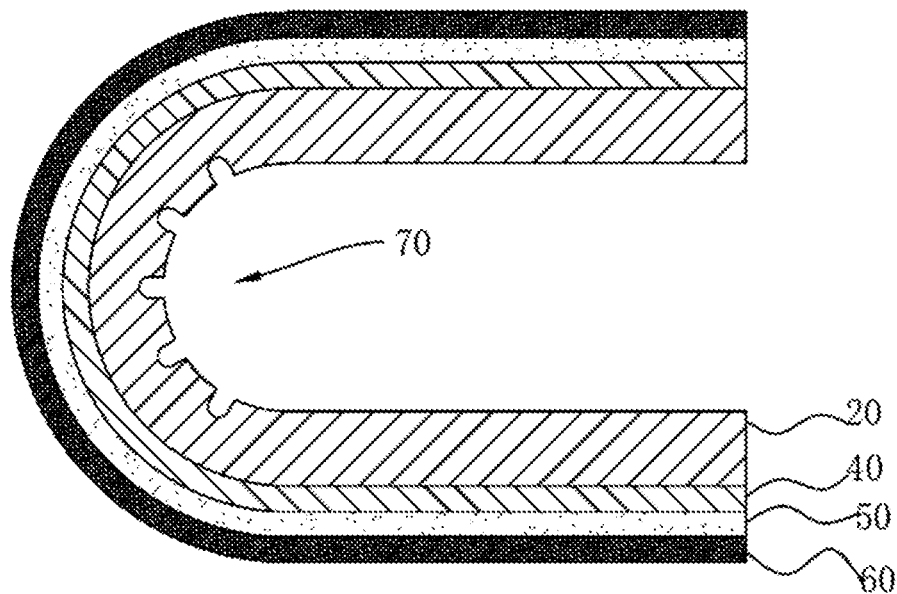
FIG. 2 is a schematic view of a flexible display panel when it is bent according to an embodiment of the present invention.

A flexible display panel is shown in FIGS. 1 and 2. The flexible display panel includes a substrate 20 made of a flexible material, a thin film transistor substrate 40 disposed on the substrate 20, a light-emitting layer 50 disposed on the thin film transistor substrate, and an encapsulation layer 60 disposed on the light-emitting layer 50.

The flexible display panel is provided with a display area and a non-display area, wherein a bending region 70 is disposed in a display area of the flexible display panel, a buffer structure 21 having a wave shape is disposed at the bending region 70 on a side of the substrate 20 away from the thin film transistor substrate 40.

The flexible display panel can be bent along the bending region 70. When the flexible display panel is bent, the stress generated when the film layer is bent is buffered by the buffer structure 21 to prevent stress concentration, thereby improving the bending resistance of the flexible display panel, reducing the effect of stress on the screen during bending.

Specifically, the buffer structure 21 is a discontinuous structure, and the buffer structure 21 includes a plurality of mutually independent grooves.

Specifically, the substrate 20 has a thickness of 1 to 15 μm, and the groove has a depth of 1 to 10 μm.

Figure 3:
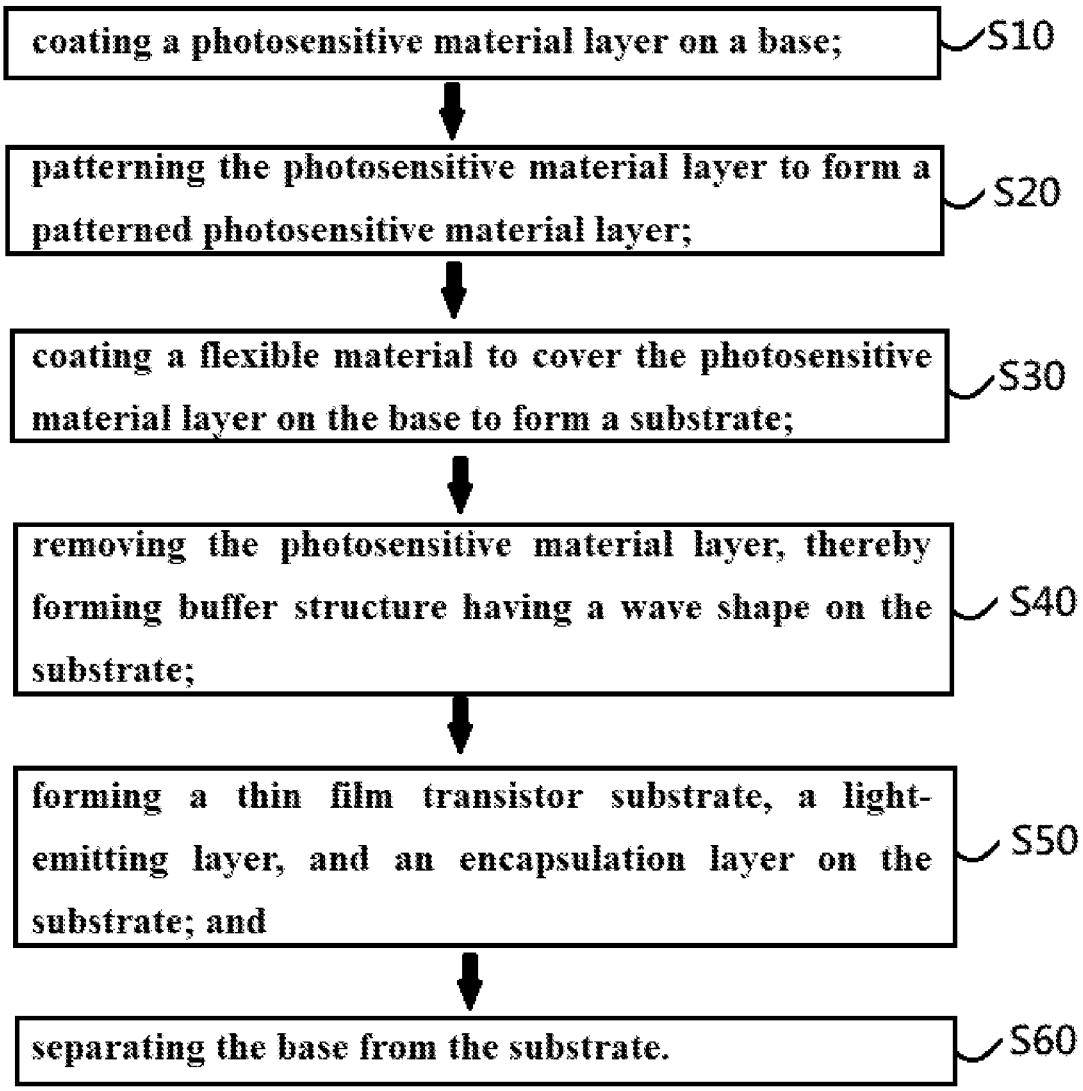
FIG. 3 is a schematic flow chart of a process of manufacturing a flexible display panel according to an embodiment of the present invention.

Based on the above flexible display panel, the present invention further provides a method of manufacturing the flexible display panel. As shown in FIG. 3, the method of manufacturing the flexible display panel includes the following steps:

S10, coating a photosensitive material layer 30 on a base 10;

S20, patterning the photosensitive material layer 30 to form a patterned photosensitive material layer 30;

S30, coating a flexible material to cover the photosensitive material layer 30 on the base 10 to form a substrate 20;

S40, removing the photosensitive material layer 30, thereby forming buffer structure 21 having a wave shape on the substrate 20;

S50, forming a thin film transistor substrate 40, a light-emitting layer 50, and an encapsulation layer 60 on the substrate 20; and S60, separating the base 10 from the substrate 20.

The patterned photosensitive material layer 30 is formed by exposure and development, and the buffer structure 21 is formed on the substrate 20 using the patterned photosensitive material layer 30. The photosensitive material layer 30 is easily removed, and therefore the manufacture is simple and efficient.

The substrate 10 is made of materials including one or more of any electrically insulating materials such as quartz, mica, and alumina.

The photosensitive material layer 30 is made of an exposure-dissolving photosensitive material or an exposure-cross-linking photosensitive material.

The steps of manufacturing the flexible display panel are as shown in FIGS. 4 to 8.

Figure 4:
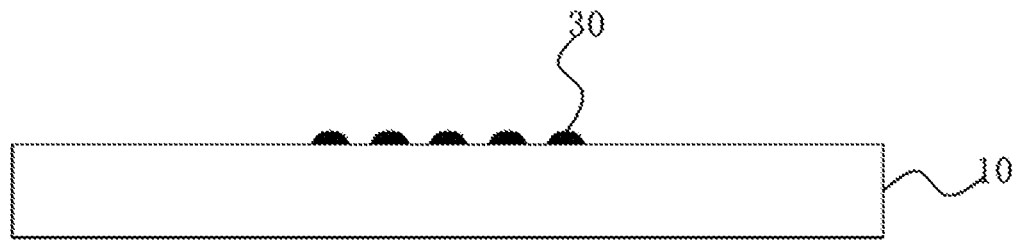
FIG. 4 to FIG. 8 are schematic diagrams showing steps of manufacturing a flexible display panel according to an embodiment of the present invention.

As shown in FIG. 4, a photosensitive material is coated on the base 10 to form a photosensitive material layer 30, and a patterned photosensitive material layer 30 is formed by exposure and development.

The photosensitive material layer 30 has a thickness of 1 to 10 μm.

Figure 5:
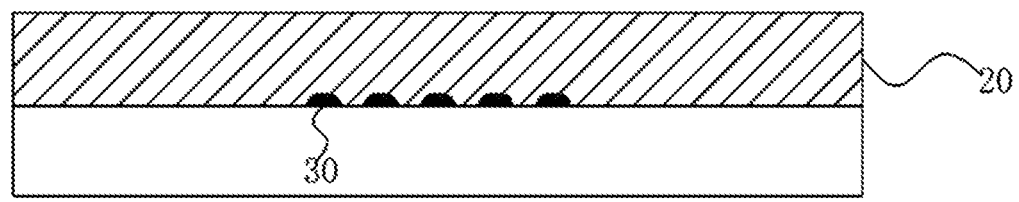

As shown in FIG. 5, the flexible material is coated to cover the photosensitive material layer 30 on the base 10 to form the substrate 20.

The flexible material may be polyimide (PI), polycarbonate (PC), polyethylene terephthalate (PET), or polyethylene naphthalate (PEN). The flexible material usually has the advantages of wide application temperature, chemical corrosion resistance, high strength, and high insulation, etc. After the flexible material is coated, the solvent and water vapor in the flexible material are removed by vacuum drying and low temperature baking.

Specifically, the substrate 20 has a thickness of 1 to 15 μm.

It should be noted that, after the substrate 20 is formed, the photosensitive material layer 30 penetrates the front and rear sides of the substrate 20.

Figure 6:
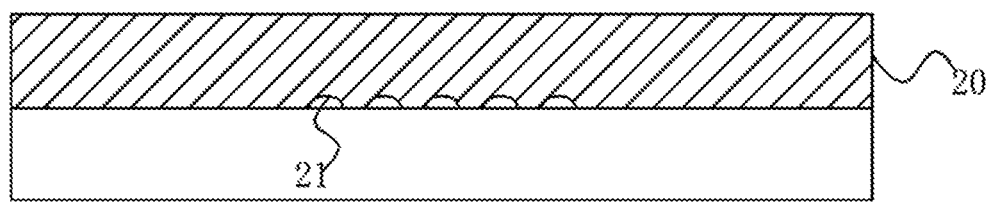

As shown in FIG. 6, in the step S40, after the substrate 20 is cured, the substrate 20 is placed in a stripping solution to remove the photosensitive material layer 30. After the photosensitive material layer 30 is removed, the buffer structure 21 having a wave shape is formed on the substrate 20. After the photosensitive material layer 30 is removed, the substrate 20 is baked at a high temperature, thus obtaining a thermal-stable buffer structure 21.

Specifically, the buffer structure 21 is a discontinuous structure, and the buffer structure 21 includes a plurality of mutually independent grooves.

Further, after the step S40, and before the step S50, the method of manufacturing the flexible display panel further includes: S70, planarizing a surface of the substrate 20.

The thermally stabilized substrate 20 is placed in a flexible grinding apparatus to polish the surface of the substrate 20 in order to remove a relatively high convex of the flexible material, thereby obtaining a flat surface of the substrate 20, facilitating formations of other film structures on the substrate 20.

Figure 7:
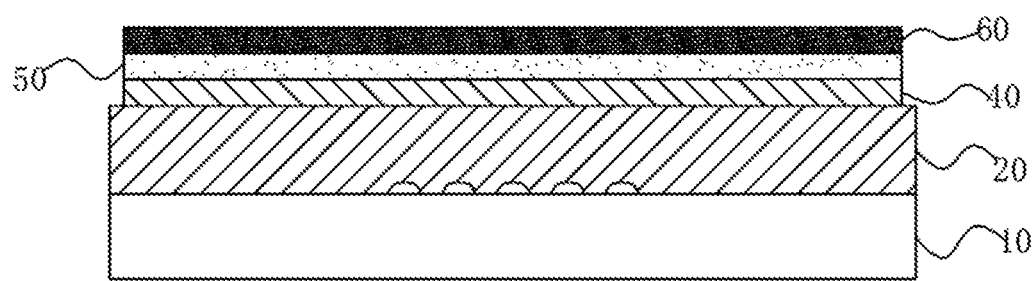

As shown in FIG. 7, the thin film transistor substrate 40, the light-emitting layer 50, and the encapsulation layer 60 are formed on the substrate 20, thereby obtaining a flexible display panel.

Figure 8:
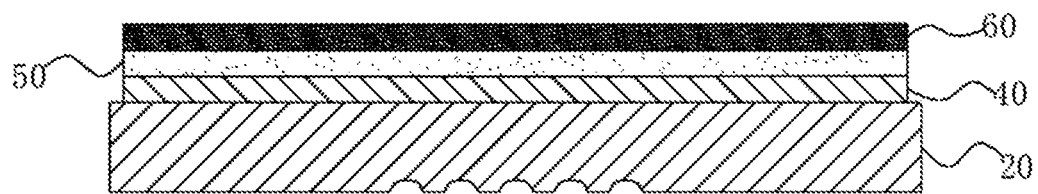

As shown in FIG. 8, the base 10 is separated from the substrate 20 by laser.

The beneficial effects of the present invention are that by providing the buffer structure 21 in the bending region 70, when the flexible display panel is bent, the stress generated when the film layer is bent is released by the buffer structure 21 to prevent stress concentration, thereby improving the bending resistance of the flexible display panel, reducing the effect of stress on the screen when it is bent.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A method of manufacturing a flexible display panel, comprising the following steps:
    S10, coating a photosensitive material layer on a base;
    S20, patterning the photosensitive material layer to form a patterned photosensitive material layer;
    S30, coating a flexible material to cover the photosensitive material layer on the base to form a substrate;
    S40, placing the substrate in a stripping solution to remove the photosensitive material layer, thereby forming a buffer structure having a wave shape on the substrate;
    S50, forming a thin film transistor substrate, a light-emitting layer, and an encapsulation layer on the substrate; and
    S60, separating the base from the substrate.

2. The method of manufacturing the flexible display panel according to claim 1, wherein after the step S40, and before the step S50, the method of manufacturing the flexible display panel further comprises:

S70, planarizing a surface of the substrate.

3. The method of fabricating a flexible display panel according to claim 1, wherein the buffer structure comprises a plurality of mutually independent grooves.

4. The method of manufacturing the flexible display panel according to claim 1, wherein the photosensitive material layer has a thickness of 1 to 10 μm.

5. The method of manufacturing the flexible display panel according to claim 1, wherein the substrate has a thickness of 1 to 15 μm.

6. The method of manufacturing the flexible display panel according to claim 1, wherein the buffer structure is a discontinuous structure.

* * * * *